(12) United States Patent
Nerad

(10) Patent No.: US 12,101,090 B2
(45) Date of Patent: Sep. 24, 2024

(54) OSCILLATOR CIRCUIT

(71) Applicant: EM Microelectronic-Marin SA, Marin (CH)

(72) Inventor: Jiri Nerad, Prague (CZ)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 18/311,360

(22) Filed: May 3, 2023

(65) Prior Publication Data

US 2024/0007086 A1    Jan. 4, 2024

(30) Foreign Application Priority Data

Jun. 30, 2022    (EP) .................................... 22182316

(51) Int. Cl.
  *H03B 5/06*    (2006.01)
  *H03B 5/08*    (2006.01)
  (Continued)

(52) U.S. Cl.
  CPC ............. *H03K 3/0231* (2013.01); *H03B 5/06* (2013.01); *H03B 5/08* (2013.01); *H03K 3/014* (2013.01); *H03K 3/03* (2013.01)

(58) Field of Classification Search
  CPC ... H03B 5/06; H03B 5/08; H03B 5/12; H03B 5/14; H03B 5/20; H03B 5/24; H03B 5/26; H03B 5/30; H03B 5/32; H03B 5/323; H03B 5/326; H03B 5/36; H03B 5/364; H03B 5/366; H03B 5/368; H03B 5/38; H03B 2200/0094; H03B 2200/0096; H03K 3/014; H03K 3/0231; H03K 3/03
  See application file for complete search history.

(56) References Cited

U.S. PATENT DOCUMENTS

| 3,641,462 | A | | 2/1972 | Fujimura |
| 5,485,128 | A | * | 1/1996 | Azuma ................... H03H 11/16 327/248 |

(Continued)

FOREIGN PATENT DOCUMENTS

| DE | 10 2020 130 518 A1 | 5/2022 |
| EP | 1 028 537 A1 | 8/2000 |

OTHER PUBLICATIONS

European Search Report issued Feb. 3, 2023 in European Application 22182316.4 filed on Jun. 30, 2022, 4 pages.

*Primary Examiner* — Levi Gannon
(74) *Attorney, Agent, or Firm* — Oblon, McClelland, Maier & Neustadt, L.L.P.

(57) ABSTRACT

The disclosure concerns an oscillator circuit (10) for a signal transmitter, the oscillator circuit (10) comprising:
  a resonant circuit (12) comprising a resonant inductor (LR) and a resonant capacitor (CR) parallel to the resonant inductor (LR) or comprising a crystal device,
  a driving branch (14) comprising a pump capacitor (CP) connected to the resonant circuit (12),
  a feedback branch (20) connected to the resonant circuit (12),
  a phase shifting circuit (22) connected to the resonant circuit (12) via the feedback branch (20),
  a comparator circuit (24) connected to the feedback branch (20) via the phase shifting circuit (22) and
  a driver circuit (28) connected to an output of the comparator circuit (24) and operable to charge the pump capacitor (CP).

14 Claims, 4 Drawing Sheets

(51) Int. Cl.
    *H03K 3/014*         (2006.01)
    *H03K 3/0231*      (2006.01)
    *H03K 3/03*          (2006.01)

(56) References Cited

U.S. PATENT DOCUMENTS

| | | |
|---|---|---|
| 6,169,462 B1 | 1/2001 | White |
| 10,312,860 B2 | 6/2019 | Stenman et al. |
| 10,581,378 B1* | 3/2020 | Verhoef ............... H03K 3/0307 |
| 11,205,995 B2 | 12/2021 | Carlton et al. |
| 2002/0033738 A1 | 3/2002 | Saeki et al. |
| 2003/0112079 A1 | 6/2003 | Saeki et al. |
| 2004/0056728 A1* | 3/2004 | Dent ...................... H03B 5/366 |
| | | 331/158 |
| 2008/0088351 A1 | 4/2008 | Kimura |
| 2009/0079510 A1* | 3/2009 | Widmer .................. H03B 5/06 |
| | | 331/160 |
| 2011/0163819 A1* | 7/2011 | Badillo ............... H03F 3/45071 |
| | | 327/246 |
| 2012/0154066 A1 | 6/2012 | Kubota |
| 2014/0049330 A1 | 2/2014 | Martin |
| 2017/0117848 A1* | 4/2017 | Nomura ................... H01F 5/00 |
| 2018/0198411 A1 | 7/2018 | Stenman et al. |
| 2018/0302034 A1* | 10/2018 | Ding ...................... H03B 5/364 |
| 2019/0229678 A1 | 7/2019 | Stenman et al. |
| 2020/0244220 A1 | 7/2020 | Van Der Zee et al. |
| 2022/0077822 A1* | 3/2022 | Casagrande ........... H03B 5/323 |
| 2022/0103126 A1 | 3/2022 | Zhang |

\* cited by examiner

OSCILLATOR CIRCUIT

CROSS-REFERENCE TO RELATED APPLICATION

This application claims priority to European Patent Application No. 22182316.4 filed on Jun. 30, 2022, the entire disclosure of which is hereby incorporated herein by reference.

TECHNICAL FIELD

The present disclosure relates to an oscillator circuit for a signal transmitter as well as to a method of generating an oscillation of an oscillator circuit.

BACKGROUND OF THE INVENTION

Electrostatic pen circuits typically support a transmit mode using amplitude shift (on-off) keying of a sinewave carrier in the megahertz band (e.g. 1.8 MHz). With electrostatic pen circuits configured for tablet computers or the like touch sensitive displays an electrostatic operation of the pen circuit requires a high-voltage amplitude at the transmitter output, such as 20V peak-peak. Small dimensions of the pen bring the need for a minimum use of external components and requires ultra-low power consumption.

Presently available design solutions include discrete transformers, e.g. to multiply the sinewave amplitude and/or on-chip charge pumps to elevate the supply voltage.

An example of a circuit assembly for generating a RF oscillation plucking pulses is for instance known from U.S. Pat. No. 6,806,783 B2.

With solutions known so far, the output voltage amplitude is typically limited by the supply voltage. Here, the use of switches to recharge a resonant capacitor by connecting it in parallel with a voltage supply means that the voltage amplitude of the oscillation, hence the peak value in one direction cannot exceed the supply voltage.

Use of a current supply to build up an oscillation has essentially the same limitation as practical implementations of current supplies (in CMOS or bipolar technologies) can only operate for a single polarity of output voltage, that is, the instantaneous output voltage of a NMOS or NPN current supply cannot go below the negative power supply rail while the output of a PMOS or PNP current supply cannot go above the positive rail. Again, the voltage amplitude of oscillations of an oscillator circuit and hence the peak value in one direction cannot exceed the supply voltage.

It is hence desirable to provide an improved oscillator circuit and a method of generating an oscillation of an oscillator circuit that overcomes the above described limitations. The oscillator circuit should be implementable in a rather cost efficient and miniaturized way. Moreover, the oscillator circuit should be implementable with silicon-based semiconductor devices and should avoid use of high-voltage silicon semiconductor devices or components.

SUMMARY OF THE INVENTION

In one aspect the present disclosure or invention relates to an oscillator circuit for a signal transmitter, typically an oscillator circuit for a pen circuit to be used with tablet computers or the like touch sensitive displays. The oscillator circuit comprises a resonant circuit. The resonant circuit comprises a resonant inductor and a resonant capacitor. The resonant capacitor is parallel to the resonant inductor. Alternative to a resonant inductor and resonant capacitor the resonant circuit comprises a crystal device.

The resonant circuit is operable to resonate at a desired oscillation frequency and is operable to provide an output voltage to be used by the signal transmitter. The oscillator circuit further comprises a driving branch. The driving branch comprises a pump capacitor connected to the resonant circuit. The oscillator circuit further comprises a feedback branch connected to the resonant circuit. The oscillator circuit further comprises a phase shifting circuit connected to the resonant circuit via the feedback branch.

Furthermore, the oscillator circuit comprises a comparator circuit connected to the feedback branch via the phase shifting circuit. The oscillator circuit further comprises a driver circuit connected to an output of the comparator circuit and being operable to charge the pump capacitor.

The pump capacitor is typically in series with the driving branch and/or is located in the driving branch of the oscillator circuit. One terminal of the pump capacitor is connected to the resonant circuit, e.g. to both of the resonant capacitor and the resonant inductor, which are parallel to each other. Another terminal of the pump capacitor is connected to an output of the driver circuit.

The feedback branch may be connected to a sensing branch by way of which the output voltage present at the resonant circuit can be sensed. Typically, the sensing branch is arranged parallel to the resonant circuit. It may comprise a first terminal connected to the driving circuit and may further comprise an oppositely located second terminal connected to ground.

Also, the resonant capacitor comprises a first terminal connected to the driving branch. It comprises a second terminal connected to ground. The resonant inductor comprises a first terminal connected to the driving branch and further comprises a second terminal connected to ground. The first terminal of the resonant capacitor and the first terminal of the resonant inductor are mutually connected. These terminals may be also connected to an output of the oscillator circuit.

The proposed oscillator circuit and its operation is fundamentally different from the prior art as it uses capacitive coupling to gradually build up an oscillation in the oscillator circuit. This allows the voltage amplitude across the resonant circuit to become much larger than both, the supply voltage of the driver circuit and the voltage range of an output terminal of the driver circuit.

The phase shifting circuit is typically implemented as a tunable phase shifting circuit. This allows for fine-tuning of a timing of amplitude plucking or driving pulses in order to minimize power consumption. The tunable phase shift circuit can be generally adjusted e.g. at the time of a production test to compensate for all timing errors in an oscillator loop.

Typically and according to a further example the oscillator circuit may be void of high-voltage silicon devices or high-voltage silicon components. The currently proposed oscillator circuit may be implemented by low-voltage silicon devices only, which offer to obtain a high-voltage sinewave signal at the output of the oscillator circuit. The currently proposed oscillator circuit uses capacitive coupling to drive the resonant circuit on the one hand and sense its transient voltage on the other hand, thereby removing a need for high-voltage silicon devices or components.

Moreover, the present oscillator circuit offers a technique to recuperate at least part of the energy of the oscillation when the output signal is ramped down in order to stop its oscillation.

Furthermore, the oscillator circuit may use a capacitive coupling to build up voltage oscillations exceeding the supply voltage of the driver circuit and also use capacitive coupling to separate a high-voltage amplitude in the resonant circuit from low-voltage driving and/or sensing circuits, that may be implemented as on-chip driving circuits or sensing circuits.

In addition, the oscillator circuit may provide an inversion of charge injection, hence to operate the driver circuit with an inverted output of the comparator circuit in order to recuperate part of the total electric energy when the oscillation needs to be stopped.

Accordingly and with the oscillator circuit as described herein there can be generated a sinewave signal with a voltage amplitude exceeding a supply voltage. The oscillator circuit may be implemented without any high-voltage silicon devices or high-voltage silicon or semiconductor components. The present oscillator circuit does not require on-chip voltage multiplication and does also not require a discrete transformer or the like.

The presently proposed oscillator circuit is implemented to use capacitive coupling, which means that no extra power dissipation will occur during its operation. The presently proposed oscillator circuit further offers a tuning mechanism to minimize a power consumption during a steady-state operation of the oscillator circuit. The oscillator circuit may further include or provide a mechanism to control ramp up or ramp down speed or time when the oscillation should be started or stopped. The oscillator circuit may further include a technique to recuperate part of the energy of the oscillation circuit when a signal amplitude is to be ramped down for stopping a respective oscillation.

According to a further example the feedback branch is connected to the resonant circuit via a feedback divider. By way of a feedback divider a well-defined fracture or portion of the amplitude of an output signal present to the resonant circuit may be supplied to the feedback branch.

In this way a low-voltage or low amplitude signal can be provided to and processed by the feedback branch and hence by the phase shifting circuit, by the comparator circuit as well as by the driver circuit when processing a feedback signal derived from the oscillation of the resonant circuit.

According to a further example the feedback divider comprises a feedback capacitor and a ground capacitor in series with the feedback capacitor. The feedback branch is connected to the resonant circuit via a node located between the feedback capacitor and the ground capacitor. Typically, the feedback divider may form or constitute a sensing branch of the oscillator circuit. A first terminal of the sensing branch may be connected to the driving branch. A second terminal of the sensing branch, e.g. opposite to the first terminal, may be connected to ground.

Typically, a first terminal of the feedback capacitor is connected to the driving branch. A second terminal of the feedback capacitor is connected to the node, which is connected to the feedback branch. A first terminal of the ground capacitor is connected to the node connected to the feedback branch and a second terminal of the ground capacitor is connected to ground.

With a further example a capacitance of the ground capacitor is larger than a capacitance of the feedback capacitor. Additionally and/or alternatively the capacitance of the resonant capacitor is larger than a capacitance of the feedback capacitor.

With further examples the capacitance of the resonant capacitor is larger than the capacitance of the pump capacitor. In typical application scenarios the capacitance of the ground capacitor is larger than the capacitance of the resonant capacitor, which is in turn larger than the capacitance of the pump capacitor or capacitance of the feedback capacitor. This means that the resonant capacitor forms the dominant part of the effective resonant capacitance that is in parallel with the resonant inductor. Such conditions may not be strictly satisfied as the contributions from the pump branch and the contributions from the feedback divider to the resulting effective resonant capacitance do not impose any practical problem.

However, the capacitance of the ground capacitor should be kept comparatively large while a capacitance of the pump capacitor and the feedback capacitor should be as small as practical in order to minimize degradation of a resulting quality factor of the resonant circuit due to a coupling to a non-zero output resistance of the driver circuit or a non-zero input conductance of the phase shifting circuit.

According to a further example the phase shifting circuit comprises a RC bridge circuit with at least one of a tunable resistor and a tunable capacitor. The bridge circuit is operable to transform a feedback signal sensed at the resonant circuit into a differential voltage for the comparator circuit. As an ideal comparator flips when its input differential voltage is zero while the ideal timing for amplitude plucking or charge injection is the minimum and maximum point of its transient sinewave voltage, the phase shifting circuit is typically operable to provide a 90° phase shift to close the feedback loop.

The RC bridge circuit may comprise two bridge resistors as well as two bridge capacitors that are arranged in a typical bridging configuration. The bridge circuit comprises a first output terminal and a second output terminal each of which is connected to respective first and second input terminals of the comparator circuit.

Here, at least one of the bridge resistors and the bridge capacitors is implemented as a tunable resistor or as a tunable capacitor. This way the bridging circuit can be tuned or fine-tuned in order to provide a variable phase shifting.

In practice, an optimal phase shift places the timing of amplitude plucking or charge injection precisely at the minimum and maximum of a transient voltage across the resonant circuit. This phase shift may differ from to compensate for delays in the comparator circuit and the driver circuit and optionally to compensate for loading effect in a cascade of the feedback divider and the phase shifting circuit.

Tuning of the phase shifting circuit may be conducted in a final stage of assembly or manufacturing of the oscillator circuit.

According to a further example the oscillator circuit also comprises a gate circuit between an output of the comparator circuit and an input of the driver circuit. By way of the gate circuit an initiating voltage input can be injected into the oscillator circuit to trigger a build-up of the oscillation of the oscillator circuit. By way of the gate circuit the oscillation of the oscillator circuit can be initiated with a single pulse applied at an input terminal of the gate circuit.

The gate circuit may also enable or offer a controlled depletion or ramp down of the oscillation circuits oscillation. This can be initiated or triggered, e.g. by applying a suitable voltage signal to the gate circuit.

According to a further example the gate circuit comprises one of an XOR gate and a digital multiplexer. Both, the XOR gate and the digital multiplexer comprise a first input terminal connected to an output of the comparator circuit and further comprise a second input terminal, which is configured to receive a transient voltage input, which is operable to initiate an oscillation of the oscillator circuit.

For initiating and oscillation of the oscillation circuit it may be sufficient to apply a single pulse at the second input terminal of the XOR gate or digital multiplexer. Due to the operation of the XOR gate or multiplexer the output of the gate circuit may change its state in response to the transient voltage input, thus leading to induce or to trigger a flip or change of the output of the driver circuit. This results in the injection of an initial charge into the resonant circuit, e.g. in the resonant capacitor, and induces a small initial oscillation of the resonant circuit, which, in turn, initiates the activity of the comparator circuit and the phase shifting circuit, which operation finally closes the feedback loop. In the following a growing sinewave will build up. Its amplitude increases until energy dissipated in the resonant circuit equals the energy supplied by the driver circuit during a sinewave period as induced by the pump capacitor during that period.

When the gate circuit is implemented as a digital multiplexer there may be provided a train of initiation pulses allowing to apply a respective initiation pulses or train of pulses directly to the driver circuit, effectively disconnecting the comparator circuit from the driver circuit and interrupting or breaking the feedback loop at least during the initiation stage of the oscillator circuit. With a multiplexer there may be provided a control signal input by way of which there can be controlled the selection of a signal source for the driver circuit. In effect, there can be provided numerous external or internal initiation sources, such as a transient voltage input in form of a single voltage peak, or there can be provided a train of initiation pulses. By way of the multiplexer an input of the driver circuit can be selectively connected to different signal sources thereby defining an operation mode of the oscillator circuit, e.g. to operate the oscillator circuit in a ramp up mode during and/or for establishing of the oscillation, to operate the oscillator circuit in a steady-state or driving mode and/or to stop the oscillation by ramping down the oscillation signal of the oscillator circuit.

According to a further example the oscillator circuit comprises an amplitude control circuit between an output of the comparator circuit and an input of the driver circuit. The amplitude control circuit comprises an envelope detector circuit operable to detect or to measure at least one of an envelope value or a peak value of a voltage across the resonant circuit. The amplitude control circuit further comprises an envelope comparator circuit connected to the envelope detector circuit and operable to compare the envelope value or peak value with a reference voltage. Furthermore, the amplitude control circuit comprises a gating circuit comprising a first input terminal connected to an output of the comparator circuit and comprising a second input terminal connected to an output of the envelope comparator circuit. The gating circuit further comprises an output terminal connected to an input of the driver circuit.

By way of the amplitude control circuit control pulses for the driver circuit can be gated, thereby disabling the amplitude plucking or charge injection when the envelope or peak value of the output signal exceeds a target value. In effect, the amplitude control circuit is operable to block a pair of two consecutive charge transfer events, hence an amplitude plucking or charge injection. Here, one full period of the comparator output, e.g. the duration of a high-level from a rising edge to the next falling edge is to be plucked completely and synchronously. This way, it can be guaranteed that not only for a charge injection at a maximum of the voltage peak but also a charge injection or amplitude plucking at the minimum of the output voltage is suppressed or prevented.

Furthermore, and according to another example the oscillator circuit comprises a latch circuit with an output connected to the second input terminal of the gating circuit and further comprises an input connected to an output of the envelope detecting comparator. The latch circuit is enabled or clocked by the output of the comparator circuit. In this way, a synchronous and complete blocking of both, charge injection at a high-level of a rising edge and charge injection at a low level of a falling edge can be synchronously suppressed or suspended.

With a further example of the oscillator circuit the driving branch comprises a first subbranch and at least a second subbranch parallel to the first subbranch. The first subbranch and the at least second subbranch and optionally any further subbranch each comprise a branch pump capacitor in series with a driver circuit and at least one of a switch and a logic gate to selectively activate or deactivate at least one of the first subbranch and the second subbranch. Here, the driver circuit is substituted by the driver circuits of the respective subbranches that are arranged in parallel.

By way of numerous parallel subbranches, which are selectively activatable by their respective gate or switch, a ratio of the pump capacitance to the resonant capacitance can be varied. This ratio defines the speed of an output amplitude ramp-up during the start phase of an oscillation. The same may hold for a ramp down of the output amplitude when the oscillation is about to stop.

The present oscillator circuit is particularly operable to generate a sinewave carrier with an amplitude shift (on-off) keying, where the oscillator is repeatedly started and the speed of the output amplitude ramp up has to be controlled. By way of numerous and selectively activatable subbranches of the driving branch the ratio of the pump capacitance to the resonant capacitance can be varied on demand. Here, the effective pump capacitance only includes those capacitances of those capacitors of subbranches that are activated and which are operated by the respective drivers of such branches.

According to a further example the combined capacitance of the branch pump capacitors is smaller than a capacitance of the resonant capacitor.

This way, the resonant capacitor forms the dominant part of the effective resonant capacitance that is in parallel with the resonant inductance.

According to a further example the oscillator circuit comprises a logic inverter between an output of the comparator circuit and an input of the driver circuit. By activating the logic inverter an inverse of the output of the comparator can be coupled into the driver circuit. This is of particular use to ramp down an oscillation of the oscillator circuit and/or to shut down and oscillation thereof.

According to a further example the logic inverter is selectively activatable to ramp down the oscillation of the resonant circuit resulting in a recuperation of electric energy.

Alternative to an inverter on the input of the driver circuit it also conceivable to provide a constant high logic level at the input of a gate circuit, which effectively inverts the output of the comparator coupled with the input of the driver circuit.

With the logic inverter the charge transfer polarity and hence injection of charges into the output signal can be inverted, thus leading to a recuperation of electric energy. Accordingly, there is provided a positive voltage step or charge transfer at the time of transient voltage minimum of the resonant circuit in one half period and there is provided a negative voltage step or charge transfer at the time of a transient voltage maximum of the resonant circuit in the other half period. This way, energy from the resonant circuit is periodically removed and returned back to the power supply, thereby recuperating electric energy.

According to a further aspect the present disclosure relates to a method of generating an oscillation of an oscillator circuit. The oscillator circuit comprises a resonant circuit. Typically, the method is to be used to operate an oscillator circuit as described above. Insofar, all effects, features and benefits described above in connection with the oscillator circuit equally apply to the method of generating an oscillation of an oscillator circuit.

In detail, the method comprises the steps of sending a feedback signal from the resonant circuit via a feedback branch. The feedback signal is then phase-shifted by a phase shifting circuit connected to the resonant circuit via the feedback branch. Then, the phase-shifted feedback signal is transferred into a differential signal by a comparator circuit and the differential signal is applied or provided to a driver circuit, which is operable to charge a pump capacitor in a driving branch of the resonant circuit. This way, the resonant circuit is coupled capacitively to the driving branch, e.g. to a resonant capacitor pumped by the driver circuit.

This way, electric energy is periodically added to the resonant capacitance and hence to the resonant circuit. In effect and at the time of a transient voltage maximum of the resonant circuit there is injected a positive charge by the driving branch, e.g. by a pump capacitor of the driving branch. With each transient voltage minimum of the resonant circuit a negative voltage step or a negative charge transfer is induced or injected by the pump capacitor. This way, a rather large voltage amplitude builds up with the oscillator circuit, with a peak-to-peak value that exceeds the amplitude and/or the supply voltage of a driver circuit.

According to a further example the step of initiating an oscillation of the oscillator circuit comprises the step of applying a voltage input to a gate circuit between an output of the comparator circuit and an input of the driver circuit. Here, the voltage input may comprise a transient voltage pulse or peak, which induces an initial oscillation of the oscillator circuit, which due to the feedback branch successively increases in magnitude until a steady state amplitude is reached, wherein electric energy added by the driving branch is equal to energy dissipated in the resonant circuit.

BRIEF DESCRIPTION OF THE DRAWINGS

In the following, some examples of a voltage limiter for an electrostatic signal receiver are illustrated are illustrated in greater detail by making reference to the drawings, in which.

DETAILED DESCRIPTION OF AN
EMBODIMENT OF THE INVENTION

Figure 1:
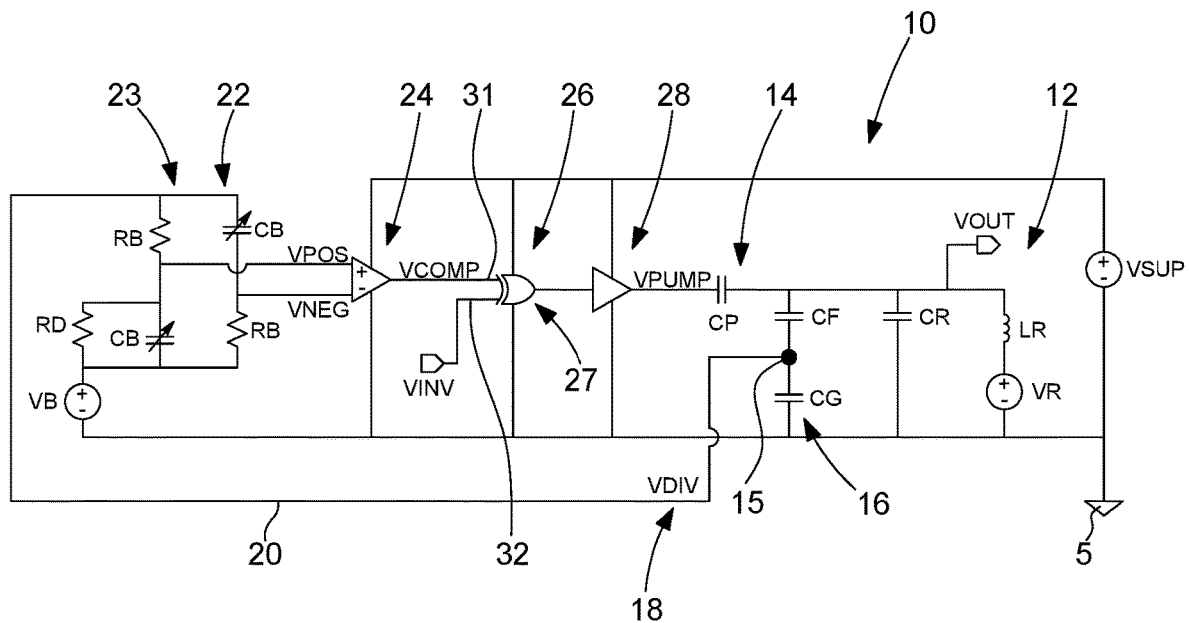
FIG. 1 is a block diagram of an example of the oscillator circuit.

An example of an oscillator circuit 10 is illustrated in FIG. 1. The oscillator circuit 10 comprises a resonant circuit 12. The resonant circuit 12 comprises a resonant inductor LR and a resonant capacitor CR, which is parallel to the resonant inductor LR. Alternatively, and instead of a resonant inductor and a resonant capacitor the resonant circuit 12 may comprise a crystal device. The oscillator circuit 10 further comprises a driving branch 14 and a feedback branch 20. Both, the driving branch 14 and the feedback branch 20 are connected to the resonant circuit 12.

The oscillator circuit 10 further comprises a phase shifting circuit 22, e.g. implemented as a RC bridge circuit 23. The phase shifting circuit 22 is connected to the resonant circuit 12 via the feedback branch 20. Furthermore, the oscillator circuit 10 comprises a comparator circuit 24 connected to an output of the feedback branch 20 via the phase shifting circuit 22. The oscillator circuit 10 further comprises a driver circuit 28 connected to an output of the comparator circuit 24 and being operable to charge the pump capacitor CP of the driving branch 14.

The driving branch 14 is provided with the pump capacitor CP. One terminal of the pump capacitor CP is connected to an output of the driver circuit 28. A second terminal of the pump capacitor CP is connected to an output terminal VOUT. The resonant circuit 12 comprises a voltage source VR. The voltage source VR is located in the branch of the resonant circuit 12 that is provided with the resonant inductor LR. A second branch of the resonant circuit 12 parallel to the branch which is provided with the resonant inductor LR is provided with the resonant capacitor CR. The branch of the resonant circuit 12 provided with the resonant capacitor CR is tied to ground 5. An opposite end of the respective branch of the resonant circuit 12 is connected to the second terminal of the pump capacitor CP.

Further parallel to the two branches of the resonant circuit 12 there is provided the sensing branch 16. The sensing branch 16 comprises a feedback divider 18. The feedback divider 18 comprises a feedback capacitor CF in series with a ground capacitor CG. The ground capacitor CG is hence shunt grounded. In a typical application scenario, the capacitance of the ground capacitor is larger than the capacitance of the feedback capacitor CF. The capacitance of the resonant capacitor CR is larger than the capacitance of any of the pump capacitor and the feedback capacitor.

This way, the resonant capacitor CR forms the dominant part of an effective resonant capacitance that is in parallel with the resonant inductor LR. However, this condition does not have to be strictly satisfied and the contribution from the pump branch 14 and the feedback divider 18 to the resulting effective resonant capacitance do not impose any technical or practical problem. It is preferred to keep the capacitance of the ground capacitor comparatively large and to provide the pump capacitor CP and the feedback capacitor CF with a comparatively small capacitance in order to minimize degradation of a resulting quality factor of the resonant circuit 12 due to a coupling of a non-zero output resistance of the driver circuit 28 or a non-zero input conductance of the phase shifting circuit 22.

The feedback divider 16 comprises a node 15 located between the feedback capacitor CF and the ground capacitor CG. The feedback branch 20 is connected to the feedback divider 18 via the node 15. An opposite end of the feedback branch 20 is connected to the phase shifting circuit 22 and in particular to a RC bridge circuit 23 of the phase shifting circuit 22. There is also provided a further voltage source VB which is operable to set a common mode voltage for a comparator input interface. Also, the voltage source VR is configured to set the underlying DC voltage for an output sinewave signal.

At least one of the capacitor CB and/or at least one of the resistors RB of the RC bridge circuit 23 is implemented as a tunable capacitor or tunable resistor, respectively. With the presently illustrated example the two bridge capacitors CB are implemented as tunable capacitors. The RC bridge circuit 23 is operable to transform a feedback signal as provided by the feedback branch 20 into a differential voltage for the comparator circuit 24. Hence, a first input terminal VPOS is connected to one terminal of the RC bridge circuit 23 and another input terminal VNEG of the comparator circuit 24 is connected to another terminal of the RC bridge circuit 23.

Figure 2:
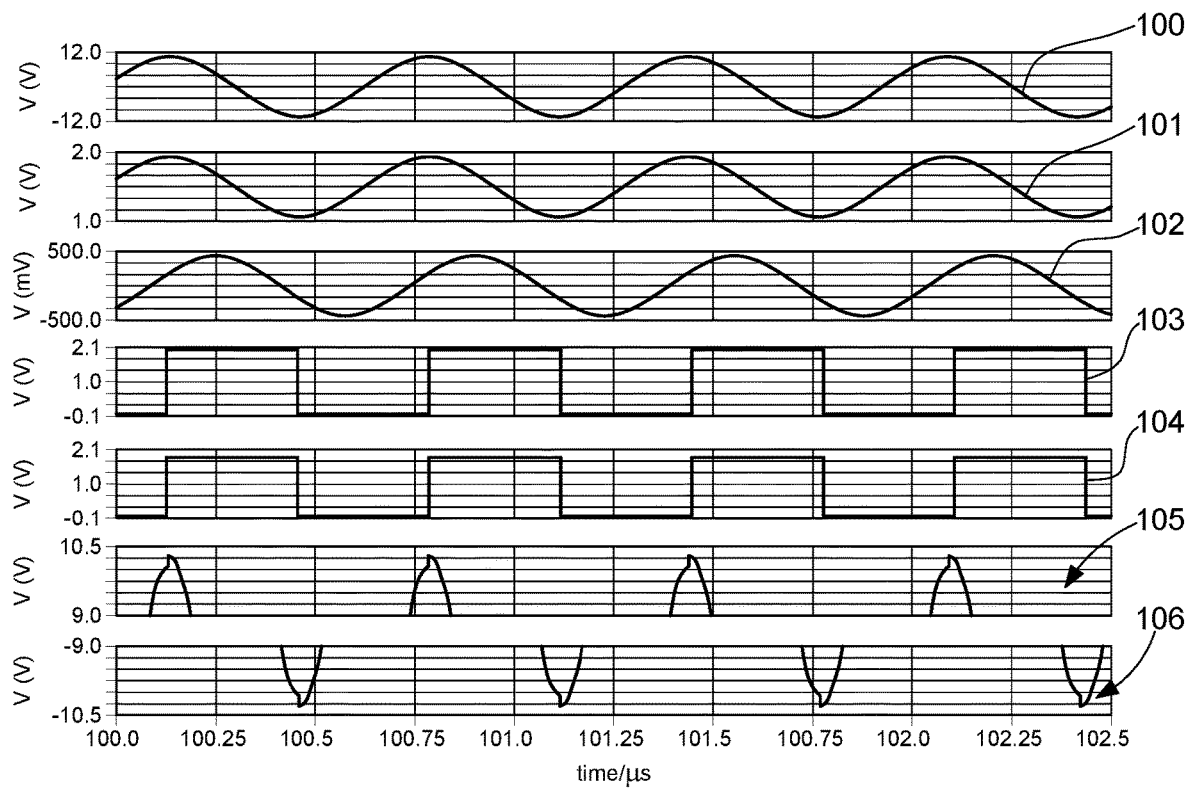
FIG. 2 shows various signals of components of the oscillator circuit over time.

An ideal comparator flips when its input differential voltage is zero while the ideal timing for amplitude plucking or charge injection for driving the present oscillator circuit 10 is the minimum and maximum point of a transient sinewave voltage provided at the output VOUT as shown as signal 100 in the graphic representation of FIG. 2. The feedback signal 101 VDIV is a scaled down version of the signal 100. The input differential signal VPOS-VNEG for the comparator circuit 24 is illustrated as a signal 102 in FIG. 2. As illustrated there, the signal 102 is approximately 90° phase shifted compared to the feedback signal 101 as provided by the feedback branch 20. The feedback signal 101 exactly follows the output signal 100 but comprises a much smaller amplitude.

Now and with the differential signal 102 present between the two input terminals VPOS and VNEG of the comparator circuit 24 an output signal VCOMP 103 of the comparator circuit 24 comprises a digital one and a digital zero. The signal of the comparator circuit 24 flips with every zero voltage transition of the differential signal 102.

The output of the comparator circuit 24 is transferred through a gate circuit 26, which is presently implemented as a XOR gate 27. As long as there is zero voltage on a second input terminal 32 of the gate circuit 26 the output of the comparator circuit 24 is unalterably gated, that is, maintained through the gate circuit 26 and is present as an input to the pump circuit 28.

The pump circuit 28 generates respective positive and negative driving signals and is operable to pump or to charge the pump capacitor CP. The respective output signal VPUMP 104 of the driver circuit 28 is illustrated also in FIG. 2.

The further signals 105 and 106 as shown in FIG. 2 are enlarged illustrations of the upper and the lower steps of the output voltage VOUT, which are superimposed at the maxima and minima of the transient voltage across the resonant circuit 12. This way, there is provided a charge injection trough the capacitive coupling of the pump capacitor CP with the driving branch 14 and hence with the resonant circuit 12.

In short, the voltage signal 100 VOUT across the resonant circuit 12 is the output voltage of the oscillator circuit 10. The signal 101 VDIV is its copy, scaled-down by the feedback capacitive divider 18. The signal 102 VPOS-VNEG is the output differential voltage of the phase shifting circuit 22, which is phase shifted by 90° compared to the signal 101. VCOMP 103 is the output signal of the comparator circuit 24 operable to control the driver circuit 28. VPUMP 104 is the output voltage of the driver circuit 28, which performs the charge injection to sustain, or to build-up the oscillation. The signals 105, 106 are enlarged illustrations to the small voltage steps due to the driving or plucking activity at the maxima and minima of the transient voltage across the resonant circuit 12.

Figure 3:
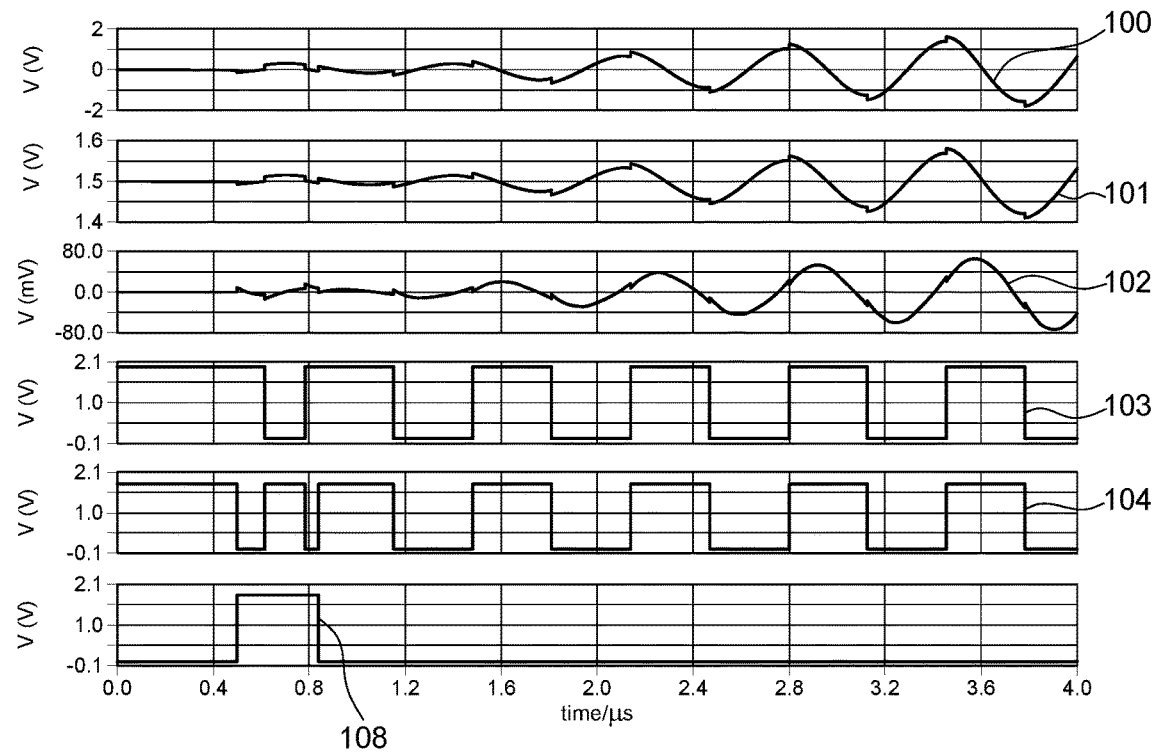
FIG. 3 illustrates numerous signals over time during a start phase of the oscillation, FIG. 4 schematically illustrates another example of a gate circuit, FIG. 5 schematically illustrates implementation of an amplitude control circuit, FIG. 6 schematically illustrates an output voltage over time for different ratios of pump capacitance over resonant capacitance.

With the illustration of FIG. 1 there is further an initiation signal 108 VINV as illustrated in FIG. 3. It is not shown in the illustration of FIG. 2 because during a steady-state operation the initiation signal VINV is zero and the XOR gate 27 simply passes the logic level from the comparator output to the input of the driver circuit.

The gate circuit 26 as illustrated in FIG. 1 comprises a first input terminal 31 connected to the output of the comparator circuit 24. The gate circuit 26 further comprises a second input terminal 32 connected to the voltage input VINV that provides an initiation signal 108 as illustrated in FIG. 3. In FIG. 3 similar voltage signals 100, 101, 102, 103 and 104 as described above in connection with FIG. 2 are illustrated correspondingly representing transient voltage waveforms at the time of initiating the oscillation by way of a single pulse 108 applied at the initiation input VINV.

Due to the operation of the XOR gate 27 the driver output flips its state, resulting in the injection of an initial charge into the resonant capacitor CR and a small initial oscillation of the resonant circuit 12, that, in turn, initiates the activity of the comparator circuit 24 via the feedback branch 20. The activity of the comparator 24 finally closes the loop and generates another driving signal 103 for the driver circuit 28. Accordingly, and as illustrated in FIG. 3 a growing sinusoidal wave is produced with an increasing amplitude until the energy dissipated in the resonant circuit 12, which is mainly due to the resonant inductor LR, during a sinewave period substantially equals the energy supplied by the driver circuit 28 by the pump capacitor CP during that period. For initiating an oscillation it is sufficient to provide only one pulse or voltage peak at the second input terminal 32 VINV of the gate circuit 26.

Figure 4:
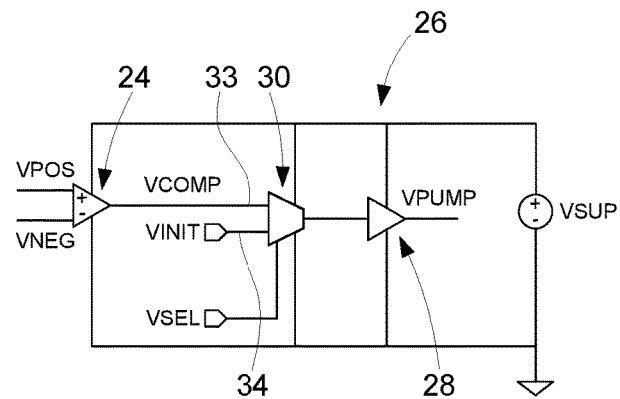

The XOR gate 27 as shown in FIG. 1 is only one example of how to implement a gate circuit 26. There is illustrated another example of a gate circuit 26 in FIG. 4 that could be used instead. There, the XOR gate 27 is replaced by a digital multiplexer 30. The digital multiplexer 30 comprises a first input terminal 33 connected to the output of the comparator circuit 24. The digital multiplexer 30 further comprises a second input terminal 34 connectable or connected to a voltage input VINIT. The multiplexer 30 comprises a VSEL input by way of which a signal source for the driver circuit 28 can be effectively selected. By providing a respective control signal to the input VSEL a driving signal from an external input VINIT can be selected at or before the start of the initiation of the oscillation to apply the external initiation pulse or a train of pulses. An internal signal VCOMP can be selected afterwards to continue the growing sinewave and to finally reach the steady-state of oscillation.

With either implementation of the gate circuit 26, comprising an XOR gate 27 or comprising a digital multiplexer 30 the topology is so robust that even in a very simple form of an initiation signal, e.g. in form of a single pulse, the oscillation starts reliably.

Figure 5:
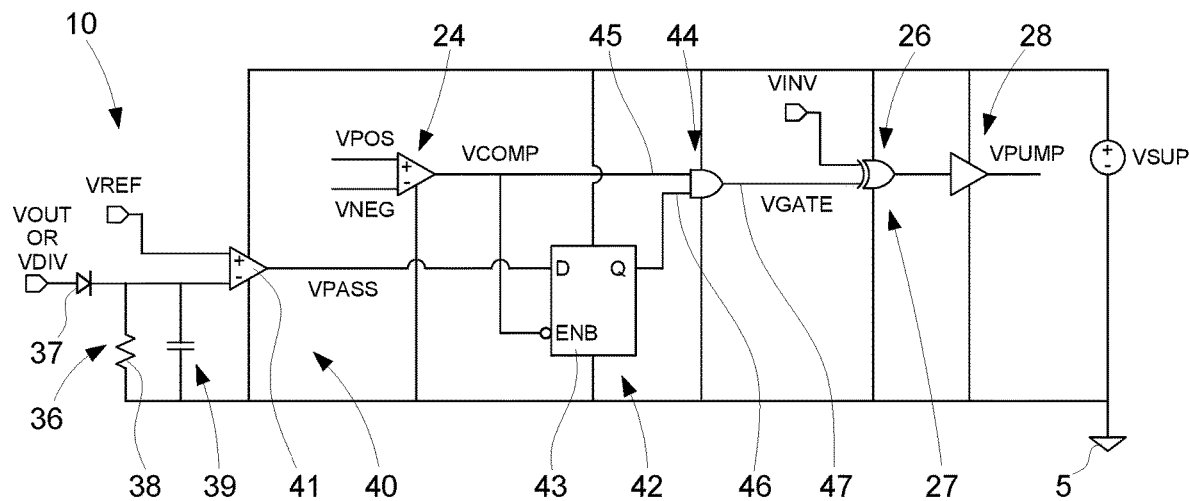

In FIG. 5 there is further illustrated an example of the oscillator circuit 10 provided with an amplitude control circuit 40. This way the present oscillator topology can be easily extended to obtain a more accurate amplitude regulation. This principle includes a gating of the control pulses for the driver circuit 28, i.e. disabling the amplitude plucking or charge injection when the envelope or peak value of the output signal exceed its target value. The presently proposed oscillator circuit 10 can only perform a driving charge transfer by making a voltage step at the output of the driver circuit 28 at and, by principle, positive and negative voltage steps. This way, positive and negative charge transfers during a period of an oscillation have to be interleaved. More precisely, the positive voltage step or charge transfer can only be performed at a time of transient voltage maximum at the resonant circuit in one half period whereas the negative voltage step or charge transfer can only be performed at a time of transient voltage minimum at the resonant circuit in the other half period.

As described before and in order to temporarily suspend an amplitude plucking or charge injection it is required to block or to suspend a pair of two consecutive charge transfer events, namely one positive and one negative charge transfer event during a first and a second half period of the oscillation of the oscillator circuit 10. This requires that a full pulse at the output of the comparator circuit 24 has to be blocked or suspended completely and synchronously.

With the example of FIG. 5 this can be reached by implementing the amplitude control circuit 40 between an output of the comparator circuit 24 and an input of the driver circuit 28. Here, the amplitude control circuit 40 comprises an envelope detector circuit 36 operable to detect or to measure at least one of an envelope value or peak value of a voltage across the resonant circuit 12. The amplitude control circuit 40 further comprises an envelope comparator circuit 41 connected to the envelope detector circuit 36. The envelope comparator circuit 41 is operable to compare the envelope value or peak value with a reference voltage VREF.

Furthermore, the amplitude control circuit 40 comprises a gate circuit 44 comprising a first input terminal 45 connected to an output of the sinewave comparator circuit 24 and a second input terminal 46 connected to an output of the envelope detecting comparator 41. The gate circuit 44 comprises an output terminal 47 connected to an input of the driver circuit 28 as described before. With some examples the gate circuit comprises a logic AND gate 44. The oscillator circuit 10 and/or the amplitude control circuit 40 further comprises a latch circuit 43 comprising an output Q connected to the second input terminal 46 of the gating circuit 44. The latch circuit 43 further comprises an input D connected to an output of the envelope detecting comparator 41. The latch circuit 43 is enabled or clocked by an output of the sinewave comparator circuit 24.

In effect the gate circuit 42 is inserted in the basic topology of the example as illustrated in FIG. 1 between the comparator circuit 24 and the XOR gate 27 in such a way that a gated sinewave comparator signal (at the output of the gating circuit 42) drives the input of the XOR gate 27.

In other words, the signal of the gate and hence the output of the gating circuit 42 is used instead of the signal VCOMP as provided by the output of the comparator circuit 24.

The envelope detector circuit 36 comprises an envelope detecting diode 37 connected to a first input terminal of the envelope detecting comparator 41. Between the envelope detecting diode 37 and the first input terminal of the envelope detecting comparator 41 there are two parallel branches that are tied to ground 5. The first branch is provided with an envelope detecting resistor 38 and the second branch is provided with an envelope detecting capacitor 39. A second input terminal of the envelope detecting comparator 41 is connected to a reference voltage VREF.

The envelope or peak detector circuit 36 is used to obtain the envelope or peak value of the sinewave of a voltage across the resonant circuit VOUT or its scaled down version VDIV, whichever is more practical in terms of a useful signal amplitude and its relation to the supply voltage VSUP of the envelope detector circuit 36. The envelope or peak value is then compared to the reference or target value with the envelope detecting comparator 41. The envelope detecting comparator 41 output VPASS is logic high when the envelope or peak value is below the target or reference voltage and therefore the amplitude plucking or charge transfer pulses are to be passed to the driver circuit 28.

The VPASS signal is then sampled by the logic latch circuit 43 that is enabled or clocked by the output of the comparator circuit 24 in such a way that the VPASS signal could be generally passed to the latch output Q when the active low enabled input ENB driven by the comparator circuit 24 is low. Otherwise, the latch circuit 43 keeps its output state at the level it had before the last transition of the active low enabled ENB signal from low to high.

The output Q of the latch circuit 43 is then used to gate the output signal VCOMP of the comparator circuit 24 further using the AND gate 44, that outputs the gated signal VGATE to the gate circuit, which in turn operates as described above.

Therefore, whenever the output signal VCOMP of the comparator circuit 24 is high the latch circuit 43 never changes its output state Q. If the VPASS is high at the time of the transition of the comparator signal VCOMP from low to high, then the full pulse is passed through the AND gate 44.

Conversely, when the output of the comparator circuit 24 VCOMP is low the latch circuit 43 changes its output state Q any time the VPASS changes its level. However, this change is not visible at the output of the AND gate 44 as a low level of the output signal VCOMP of the comparator circuit 24 implies low and constant level of the output signal VGATE of the gating circuit 42.

Figure 7:
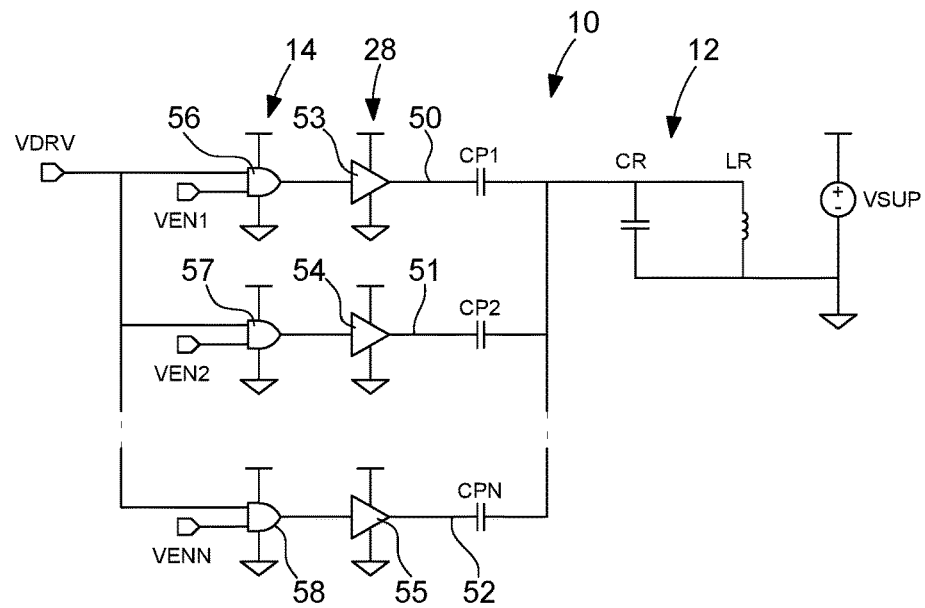
FIG. 7 shows a further example of a driving branch with numerous subbranches.

A further example of the oscillator circuit 10 comprises a driving branch 14 as illustrated in FIG. 7. This driving branch 14 comprises a first subbranch 50, a second subbranch 51 and a third subbranch 52. The number of subbranches may be even expanded to a larger integer number n, wherein in is larger than 2. Each one of the subbranches 50, 51, 52 comprises a branch pump capacitor CP1, CP2, CPN in series with a driver circuit 53, 54, Furthermore, each one of the subbranches 50, 51, 52 comprises a switch or a logic gate 56, 57, 58 to selectively activate or to selectively deactivate at least one of the first subbranch 50 and the second or third subbranches 51, 52.

By way of numerous subbranches comprising a branch capacitor CP1, CP2, CPN there can be provided an effective pump capacitance, which is a capacitance constituted by the coupling of the individual or branch pump capacitors CP1, CP2, CPN. This way, the ratio between the resonant capacitance, hence the capacitance of the resonant capacitor CR and the pump capacitance can be varied on demand. By varying the ratio of the effective pump capacitance versus the resonant capacitance there can be provided an amplitude ramp control of the oscillator circuit 10.

Figure 6:
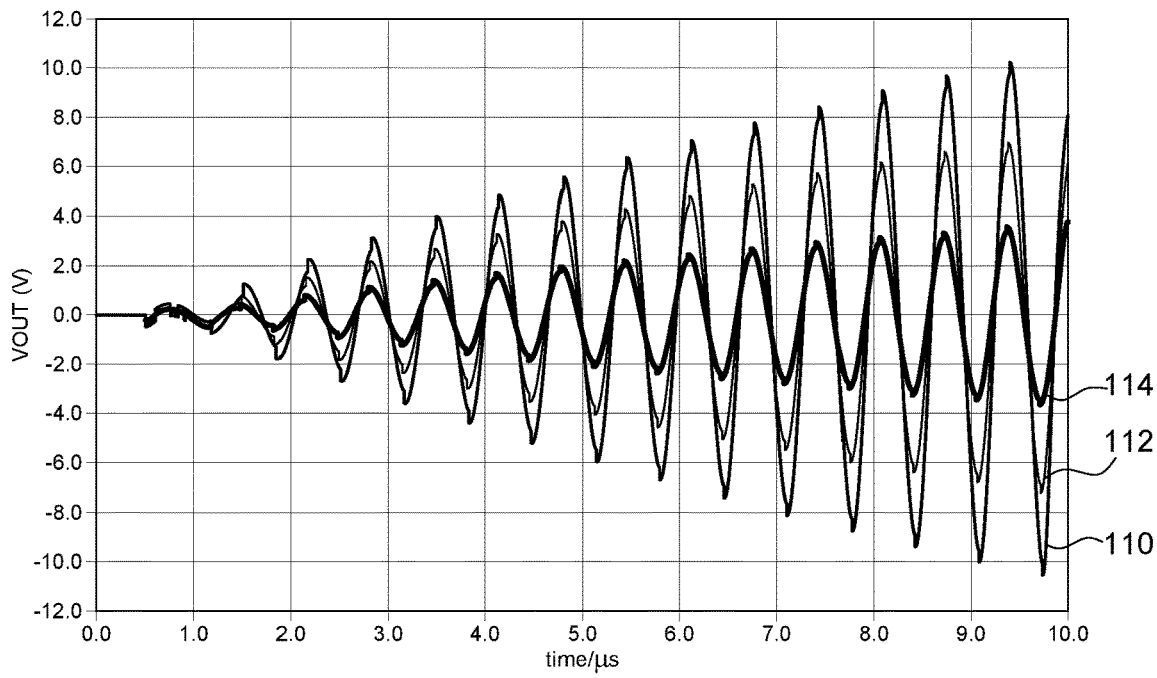

In effect, it is the ratio of the pump capacitance to the resonant capacitance that defines the speed of an output amplitude ramp-up. In FIG. 6 there are illustrated three examples of different ratios CPUMP/CR. The signal 114 is indicative of a ratio CPUMP/CR of 0.1. The signal 112 is obtained by a ratio CPUMP/CR of 0.2 and the signal 110 is obtained by a ratio CPUMP/CR of 0.3. The main application of the present oscillator circuit 10 is the generation of a sinewave carrier with amplitude shift (on-off) keying, where the oscillator is repeatedly started, and the speed of output amplitude ramp-up has to be controlled.

The technique of controlling the effective value of the pump capacitance is the use of a parallel combination of multiple pump or branch capacitors CP1, CP2, CPN as shown in FIG. 7. The logic gates 56, 57, 58 are implemented as AND gates. By applying an enable signal to the input terminals VEN1, VEN2 or VENN to the various logic gates 56, 57, 58 the respective branches 50, 51, 52 can be enabled or activated and the respective driver circuit 53, 54, 55 is operable to charge the respective branch pump capacitor CP1, CP2, CPN.

Hence, the individual driver circuits 53, 54, 55 with enabling signals at logic high perform a charge transfer activity as described above while those driver circuits 53, 54, 55 with enabling signals at logic low keep their outputs at logic low. All driver circuit outputs are in the low impedance state at all times. Consequently, the effective pump capacitance only includes capacitances of those capacitors driven by the active or enabled driver circuits while the total effective resonant capacitance includes all pump capacitors as they are all effectively in parallel with the resonant circuit 12.

Therefore, the resulting resonant frequency does not change as individual driver circuits 53, 54, 55 are enabled or disabled. This way there can be offered an independent control of oscillation frequency and ramp-up speed. The basic topology of the oscillator circuit 10 as described above e.g. in connection with FIG. 1 and its operation as illustrated in FIG. 2 are designed to use the power supply VSUP. The driver circuit 28 is powered by the voltage source VSUP to periodically add energy to the resonant capacitance CR in order to compensate for the losses in the resonant circuit 12 and sustain a periodic oscillation of the oscillator circuit 10.

The operation of the oscillator circuit 10 can be also inverted to periodically remove energy or portions of energy from the resonant circuit 12, in particular from the resonant capacitor CR and return it back to the power supply in order to obtain a recuperation of electric energy.

A recuperation of energy can be obtained by inverting the charge transfer polarity. In contrast to a sustained oscillation shown in FIG. 2 for recuperating energy from the resonant circuit 12 it is intended to induce a positive voltage step or a positive charge transfer at the time of a transient voltage minimum of the resonant circuit 12 at one half period and to add a negative voltage step or to withdraw a charge at the time of a transient voltage maximum of the resonant circuit 12 in the other half period.

This can be obtained by a rather simple modification of the oscillator circuit 10 as shown in FIG. 1.

For this it is only required to provide a logic inversion between the comparator circuit 24 and the driver circuit 28. In particular, the gate circuit 26, e.g. the XOR gate 27 as described in FIG. 1 can serve multiple purposes. In addition to an initiation of an oscillation by applying a pulse at the voltage input VINV, it can be used to start recuperation and a ramp down of the oscillation amplitude by applying a constant high logic level at the voltage VINV.

This implies that due to the logic function of the XOR gate 27 the input signal to the driver circuit 28 will be the logic inverse of the output signal of the comparator circuit 24. Use of the XOR gate 27 is only an example of how to perform a logic inversion between the output of the comparator circuit 24 and the input of the driver circuit 28. There may be numerous further ways of how to obtain such a logic inversion.

Figure 9:
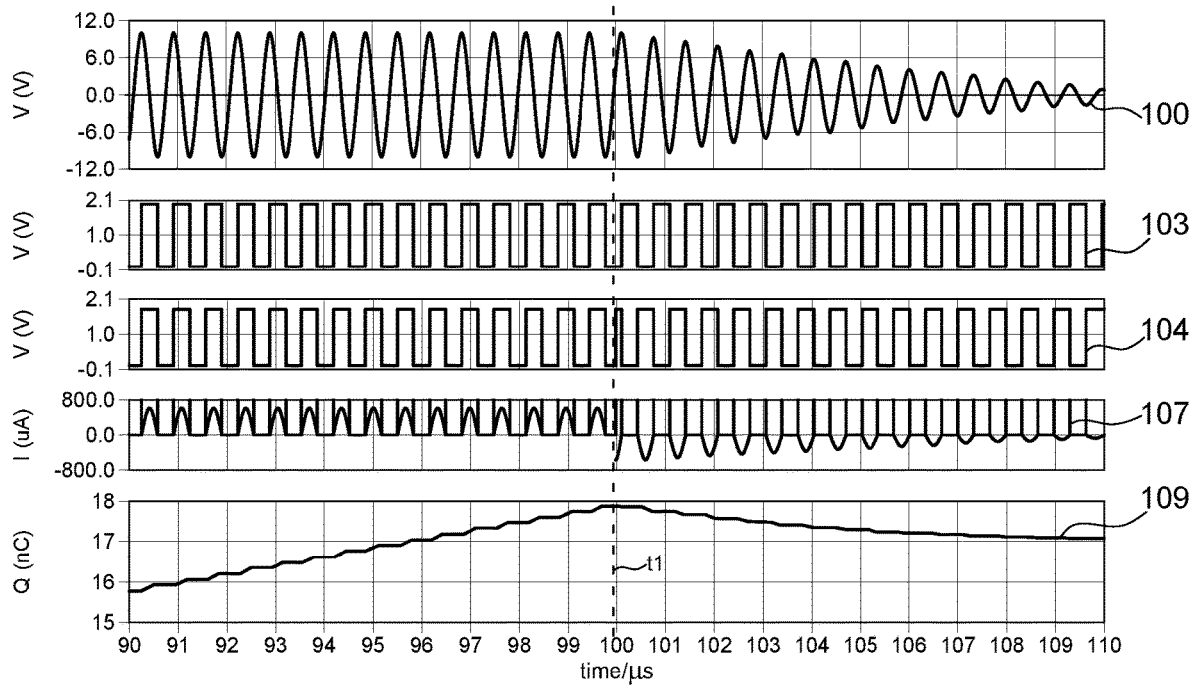
FIG. 9 illustrates numerous voltage signals during a steady-state driving operation and a subsequent ramp down procedure and FIG. 10 shows a flowchart of the method of generating an oscillation of an oscillator circuit.

In the illustration of FIG. 9 an example of a logic inversion is schematically illustrated. The signal 100 is the output voltage of the resonant circuit 12. Signal 103 represents the output of the comparator circuit 24. The signal 104 represents the output of the driver circuit 28. Before the time t1 the output voltage of the driver circuit 28 is a logic copy of the output of the comparator circuit 24. At the time t1 the logic inversion starts and the output of the driver circuit 28 becomes a logic inverse of the output of the comparator circuit 24. Consequently, the signal 107 representing the transient supply current taken by the driver circuit from the power supply will become transiently negative and the dominant supply current invert their polarity at time t1 thus indicating that the recuperation operation starts.

The further signal 109 represents the indefinite integral of the transient supply current, corresponding to the total charge or energy taken from the power supply. After the start of the recuperation mode at the time t1 part of the total charge or energy is returned to the power supply.

Figure 8:
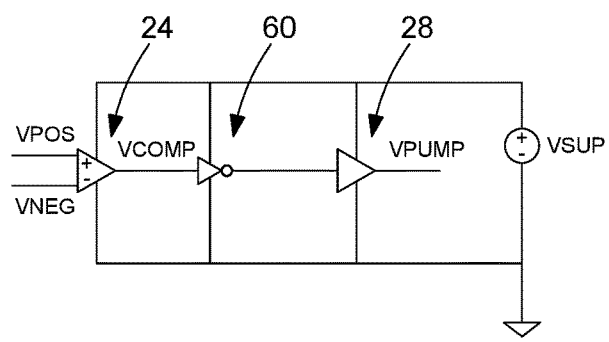
FIG. 8 shows an implementation of a logic inverter between the comparator circuit and the driver circuit.

In effect, the use of the recuperation operation as illustrated in FIG. 8 provides an energy harvesting and hence a saving of energy of more than 5% of total energy taken by the driver circuit 28.

Figure 10:
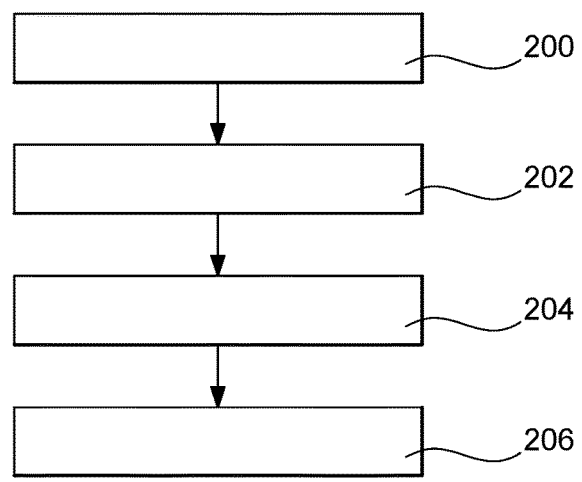

In FIG. 10 there is further illustrated a flowchart of a method of generating an oscillation of an oscillator circuit 10. The oscillator circuit 10 is typically implemented in a way as described above in connection with any of the FIGS. 1-9. In a step 200 a feedback signal is sensed from the resonant circuit 12 via the feedback branch 20. In step 202 the feedback signal is phase shifted by a phase shifting circuit 22, which is connected to the resonant circuit 12 via the feedback branch 20. In the subsequent step 204 the phase shifted signal is applied to a comparator circuit 24 that outputs a logic signal that is in turn used to control a driver circuit 28, which is operable to charge the pump capacitors CP in a driving branch 14 of the resonant circuit 12.

In the further step 206 a positive voltage step is applied or added to an evolving or already existing transient voltage maximum of the resonant circuit 12 at one half period of the oscillation. A negative voltage step or a charge transfer is provided at the time of a transient voltage minimum of the resonant circuit in the other half period. This way an oscillation of the oscillator circuit 10 can be either sustained or build-up.

In general, the oscillator circuit 10 can be followed by any rectifier circuit to form a DC voltage multiplier or a charge pump that generates a comparatively large DC voltage. Such a combined circuit can be useful for static applications that do not draw DC current from the high-voltage domain.

Furthermore, and in order to optimize the temperature performance of the oscillator circuit 10 the bias current for the comparator circuit 24 can be generated to track the time constant of the bridge circuit 22, i.e. the product of RB and CB, for instance, by using the same resistor type in the bridge circuit 22 and the bias generator for the comparator circuit 24.

REFERENCE NUMBERS 5 ground
10 oscillator circuit
12 resonant circuit
14 driving branch
15 node
16 sensing branch
18 feedback divider
20 feedback branch
22 phase shifting circuit
23 RC bridge circuit
24 comparator circuit
26 gate circuit
27 XOR gate
28 driver circuit
30 multiplexer
31 input terminal
32 input terminal
33 input terminal
34 input terminal
36 envelope detector circuit
37 envelope detecting diode
38 envelope detecting resistor
39 envelope detecting capacitor
40 amplitude control circuit
41 envelope detecting comparator
42 gating circuit
43 latch circuit
44 AND gate
45 input terminal
46 input terminal
47 output terminal
50 subbranch
51 subbranch
52 subbranch
53 driver
54 driver
55 driver
56 gate
57 gate
58 gate
60 inverter

The invention claimed is:

1. An oscillator circuit for a signal transmitter, the oscillator circuit comprising:
a resonant circuit comprising a resonant inductor connected between an oscillator output and ground and a resonant capacitor connected between the oscillator output and ground, that is parallel to the resonant inductor,
a driving branch comprising a pump capacitor connected to the oscillator output, and connected to the resonant capacitor and the resonant inductor of the resonant circuit,
a feedback branch connected to the resonant circuit, via a feedback divider connected between the oscillator output and ground, and connected in parallel to the resonant circuit, wherein the feedback divider comprises a feedback capacitor connected in series with a ground capacitor between the oscillator output and ground, and wherein the feedback branch is connected to the resonant circuit via a feedback node located to the connection of the feedback capacitor and the ground capacitor,
a phase shifting circuit connected to the resonant circuit via the feedback branch, wherein the phase shifting circuit comprises a RC bridge circuit having an input terminal connected to the feedback branch and having a differential output comprising two output terminals connected to two signal nodes,
a voltage comparator circuit connected to the feedback branch via the RC bridge circuit of the phase shifting circuit, wherein two differential input terminals of the comparator circuit are connected to the two signal nodes driven by the two differential output terminals of the RC bridge circuit and wherein the voltage comparator circuit is operable to compare the voltages at the two signal nodes, and
a driver circuit comprising an input terminal driven by the output of the voltage comparator circuit and operable to charge the resonant capacitor via the pump capacitor.

2. The oscillator circuit according to claim 1, wherein a capacitance of the ground capacitor is larger than a capacitance of the feedback capacitor and/or is larger than a capacitance of the resonant capacitor.

3. The oscillator circuit according to claim 2, wherein the capacitance of the resonant capacitor is larger than the capacitance of the pump capacitor and/or larger than the capacitance of the feedback capacitor.

4. The oscillator circuit according to claim 1, wherein the phase shifting circuit comprises a RC bridge circuit with at least one of a tunable resistor and a tunable capacitor.

5. The oscillator circuit according to claim 1, further comprising a gate circuit between an output of the comparator circuit and an input of the driver circuit.

6. The oscillator circuit according to claim 5, wherein the gate circuit comprises one of an XOR gate and a digital multiplexer with a first input terminal connected to an output of the comparator circuit and a second input terminal configured to receive a transient voltage input, which is operable to initiate an oscillation of the oscillator circuit.

7. The oscillator circuit according to claim 1, further comprising an amplitude control circuit between an output of the comparator circuit and an input of the driver circuit, wherein the amplitude control circuit comprises:
an envelope detector circuit operable to detect or to measure at least one of an envelope value or a peak value of a voltage across the resonant circuit,
an envelope comparator circuit connected to the envelope detector circuit and operable to compare the envelope value or peak value with a reference voltage,
a gating circuit comprising a first input terminal connected to an output of the comparator circuit and a second input terminal connected to an output of the envelope detecting comparator and comprising an output terminal connected to an input of the driver circuit.

8. The oscillator circuit according to claim 7, further comprising a latch circuit comprising an output connected to the second input terminal of the gating circuit and comprising an input connected to an output of the envelope detecting comparator, wherein the latch circuit is enabled or clocked by the output of the comparator circuit.

9. The oscillator circuit according to claim 1, wherein the driving branch comprises a first subbranch and at least a second subbranch parallel to the first subbranch, wherein the first subbranch and the at least second subbranch each comprise a branch pump capacitor in series with a driver circuit and at least one of a switch or a logic gate to selectively activate or deactivate at least one of the first subbranch and the second subbranch.

10. The oscillator circuit according to claim 1, further comprising a logic inverter between an output of the comparator circuit and an input of the driver circuit.

11. The oscillator circuit according to claim 10, wherein the logic inverter is selectively activatable to ramp down an oscillation of the resonant circuit resulting in a recuperation of electric energy.

12. A method of generating an oscillation of an oscillator circuit comprising a resonant circuit, the method comprising the steps of:
- sensing a feedback signal from the resonant circuit via a feedback branch,
- phase shifting the feedback signal by a phase shifting circuit connected to the resonant circuit via the feedback branch,
- transferring the phase shifted feedback signal into a logic signal by a comparator circuit and
- applying the logic signal to a driver circuit operable to charge a resonant capacitor of the resonant circuit via a pump capacitor in a driving branch of the resonant circuit.

13. The method of claim 12, further comprising the step of initiating an oscillation of the oscillator circuit by applying a voltage input to a gate circuit between an output of the comparator circuit and an input of the driver circuit.

14. An oscillator circuit for a signal transmitter, the oscillator circuit comprising:
- a resonant circuit connected between an oscillator output and ground,
- a driving branch comprising a pump capacitor connected to the oscillator output and connected to the resonant circuit,
- a feedback branch connected to the resonant circuit, via a feedback divider connected between the oscillator output and ground, and connected in parallel to the resonant circuit, wherein the feedback divider comprises a feedback capacitor connected in series with a ground capacitor between the oscillator output and ground, and wherein the feedback branch is connected to the resonant circuit via a feedback node located to the connection of the feedback capacitor and the ground capacitor,
- a phase shifting circuit connected to the resonant circuit via the feedback branch, wherein the phase shifting circuit comprises a RC bridge circuit having an input terminal connected to the feedback branch and having a differential output comprising two output terminals connected to two signal nodes,
- a voltage comparator circuit connected to the feedback branch via the RC bridge circuit of the phase shifting circuit, wherein two differential input terminals of the comparator circuit are connected to the two signal nodes driven by the two differential output terminals of the RC bridge circuit and wherein the voltage comparator circuit is operable to compare the voltages at the two signal nodes, and
- a driver circuit comprising an input terminal driven by the output of the voltage comparator circuit and operable to charge the resonant circuit via the pump capacitor.

\* \* \* \* \*